(12) United States Patent  (10) Patent No.: US 6,207,944 B1
Spartiotis et al.  (45) Date of Patent: Mar. 27, 2001

(54) SEMICONDUCTOR IMAGING DEVICE

(75) Inventors: Konstantinos Evangelos Spartiotis, Athens (GR); Jouni Ilari Pyyhtiä, Vantaa; Tielang Cao, Espoo, both of (FI)

(73) Assignee: Simage, O.Y., Espoo (FI)

( * ) Notice: Subject to any disclaimer, the term of this patent is extended or adjusted under 35 U.S.C. 154(b) by 0 days.

(21) Appl. No.: 09/035,768

(22) Filed: Mar. 6, 1998

(51) Int. Cl.[7] .......................... H01L 27/146; H01L 31/00; G01T 1/24
(52) U.S. Cl. ....................................... 250/208.1; 250/214 R
(58) Field of Search ............................... 250/208.1, 208.2, 250/214 R, 214.1, 339.02, 370.01, 370.08, 370.09; 257/225, 231, 249, 444, 448

(56) References Cited

U.S. PATENT DOCUMENTS

| 4,871,921 | * | 10/1989 | Gurnee | 250/208.1 |
| 5,313,055 | | 5/1994 | Shiratsuki et al. | 250/208.1 |
| 5,391,881 | | 2/1995 | Jeuch et al. | 250/370.09 |
| 5,498,880 | * | 3/1996 | Lee et al. | 250/580 |
| 5,929,433 | * | 7/1999 | Cluzel et al. | 250/208.1 |

FOREIGN PATENT DOCUMENTS

| 0 421 869 | 4/1991 | (EP) . |
| 2 289 980 | 12/1995 | (GB) . |
| 2 305 095 | 3/1997 | (GB) . |
| 2 305 096 | 3/1997 | (GB) . |
| 2 315 157 | 1/1998 | (GB) . |
| 2315157 * | 1/1998 | (GB) ........................ H01L/25/065 |

* cited by examiner

Primary Examiner—John R. Lee
(74) Attorney, Agent, or Firm—Kenyon & Kenyon

(57) ABSTRACT

A semi-conductor imaging device, for example for x-ray imaging, uses a detector substrate exposable to incident radiation and having a plurality of charge collection contacts for collecting charge therefrom, the detector substrate being arranged in front of a readout substrate carrying or comprising readout circuitry, the readout substrate using a first region with a respective cell circuit coupled to each charge collection contact for receiving signals from the detector substrate, and a second region with further circuitry, and such that the charge collection contacts are arranged over both the first and second regions of the readout substrate. A conductive path connects each charge collection contact over the second region with a respective terminal for contacting an input of a cell circuit in the first region. The invention enables the part of the detector substrate overlying the additional circuitry to be used as active detection area.

40 Claims, 8 Drawing Sheets

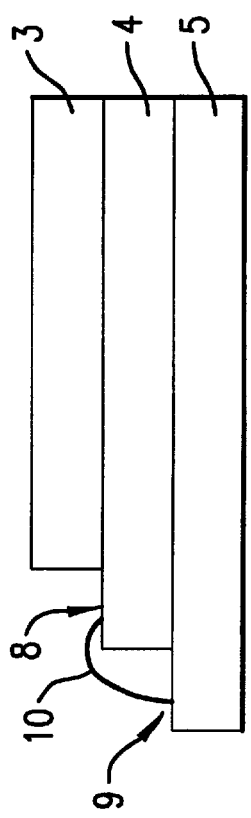
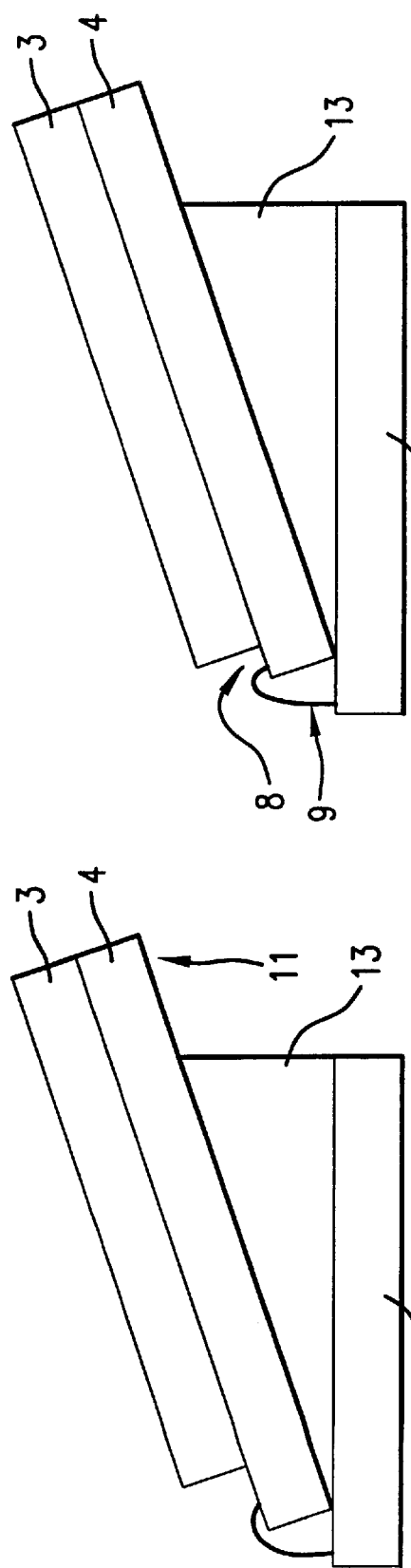

SEMICONDUCTOR IMAGING DEVICE

FIELD OF INVENTION

This invention relates to an imaging device, in particular to a semiconductor imaging device. The invention finds application to large area imaging, and is particularly suitable for X-ray imaging.

BACKGROUND OF INVENTION

Imaging devices are used in medical diagnosis, biotechnology or industrial non-destructive testing and quality control. Imaging is mostly carried out by means of ionizing radiation such as X-rays, gamma rays or beta rays. Radiation is detected by an imaging surface which need not be planar. Image formation is carried out either by viewing the two dimensional array representing the radiation intensity incident on the detector or by decoding and/or combining one or more sets of images (coded aperture imaging in nuclear medicine, computerized tomography).

The traditional imaging device is cassette film. Other devices developed and utilized over the past 40 years include wire chambers, scintillating crystals or screens (e.g., sodium iodide NaI), BGO crystals, and digital imaging plates (CR plates) using stimulated luminescence. More recently, semiconductor devices have been employed, such as charge coupled devices (CCDs), either stand alone or coupled to scintillating screens, silicon (Si) microstrip detectors, and semiconductor pixel detectors.

Semiconductor pixel imaging devices, based on ASIC (application specific integrated circuit) CMOS processing are a most desirable option for imaging applications given their high image resolution, compactness, direct detection capability, high absorption efficiency and ability to offer real time imaging. However, limitations in ASIC CMOS technology limit the practical size of monolithic detectors to a maximum area of a few square centimeters. It is desirable to utilize several such monolithic detectors in order to form a large are "tiled" imaging surface. Such an approach is described in UK Pat. No. 2305096 and UK Pat. No. 2305095. Using straightforward computer reconstruction, the data from the individual monolithic detectors can be combined to form a generally continuous large area image equivalent to the image from a hypothetical single detector having the same overall imaging area.

However, it has been a major problem to eliminate the inactive areas between the active imaging areas of adjacent detector devices. Such inactive areas decrease the resolution of the overall imaging surface below the excellent resolution usually associated with each individual detector, and cause blind regions.

FIG. 1 illustrates one proposal (described in the U.S. Pat. No. 5,812,191), in which the imaging devices 2 are staggered apart on the imaging plane 1. The imaging surface is displaced within the imaging plane, and several exposures are taken at different times with the devices 2 in different spatial positions. By combining the output information from the different exposures, a complete image can be built up, covering the whole image area with no inactive regions.

An alternative proposal for reducing inactive regions in tiling (which does not include motion) is to position the detectors in a tightly packed arrangement (see FIG. 2), which covers the whole imaging plane 1, leaving no free space between adjacent detector devices 2. This arrangement addresses the problem of inactive area between adjacent detector devices, but it cannot address the problem that each detector element may have an inactive surface area or region within the boundary of the device.

For example, FIG. 3 illustrates a known construction of an imaging device tile or module, described in the Applicants' PCT application No. WO-A-95/333332. The device consists of a semiconductor substrate 3 exposable to incident radiation, and arranged in front of an integrated circuit 4. The integrated circuit is itself supported on a mount 5, for example, a printed circuit board (PCB). By means of a uniform electric drift field, the charge generated in the substrate 3 by the incident radiation drifts towards detector cells, or pixels, defined by metal contacts on the surface of the substrate adjacent to the integrated circuit 4. The contacts are connected by microbumps (for example, indium or solder bumps) to read out circuits in the integrated circuit and aligned with the positions of the substrate contacts. The read out circuits, the product of ASIC CMOS technology, accumulate the generated charged from successive radiation hits.

In FIG. 3, an edge projection 8 or the integrated circuit board, and a further edge projection 9 of the mount are required to provide room for wire connections 10 between the mount 5 and the integrated circuit 4. It will be appreciated that when several modules are arranged side by side, the projecting regions 8 and 9 create an inactive area within the boundaries of the detector.

The present invention has arisen from an appreciation of the problems and inter-relationship between the techniques discussed below.

One approach developed by the present applicant for dealing with the inactive area problem is to incline the substrate 3 and the integrated circuit 4 relative to the mount 5, and to arrange the mounts 5 closely such that the uplifted end 11 of each detector overlaps the edge regions 8 and 9 of an adjacent detector. Such a technique is illustrated in FIG. 4 and is described in the UK Pat. No. 2,315,157. The inclination (typically about 3 degrees) is achieved by a supporting wedge 13 carried on the mount 5. This can achieve generally planar overall imaging surface with little or no image loss in the regions of overlap.

However, the above arrangement may not be sufficient if the detector has inactive regions along two perpendicular edges. For example FIG. 5 illustrates schematically (from above) a detector having an integrated circuit with a projecting edge region 8 to which the wire connections 10 are made, a read-out cell or pixel circuit area 14 comprising an array of read out circuits for connection to the pixel contacts of the substrate, and a second edge area 15 containing control and multiplexing circuitry. With such an arrangement, the detector has two inactive edge regions 8 and 15 in orthogonal directions. The arrangement in FIG. 4 does not address image continuity in two perpendicular dimensions.

Reference is also made to EP-A-0421869 which illustrates a published known design said to be capable of providing two dimensional image continuity. Referring to FIG. 6 the detector tiles are stacked in two dimensions. A significant disadvantage is that this technique necessarily increases the thickness of the overall detector; this effect becomes more pronounced as more tiles are included. It may be difficult to obtain a symmetrical detector arrangement or a planar effective image surface. Furthermore, the design relies on the existence of tiles with a sensitive or active area extending to at least two tile edges.

SUMMARY OF THE INVENTION

The present invention has been devised bearing the above problems in mind. In contrast to the prior art in which each pixel charge collection contact of the detector substrate is in register with an associated read-out cell circuit for the contract, in one aspect of the present invention, at least one charge collection contact of the semiconductor substrate is offset away from its associated cell circuit and/or from the input of the respective cell circuit.

With the invention it has been appreciated that by deviating from a conventional design in which each pixel contact overlies its associated cell circuit, it is possible to extend the active area of the substrate (i.e., the charge collection area from which image signals can be collected by the charge collection contacts) even over regions of the integrated circuit which are needed for control and/or decoding and/or multiplexing and/or post read out circuitry.

This is particularly advantageous as it enables the inactive area of the prior art to be avoided. The resolution of images produced by tiled or mosaiced imaging surfaces can thereby be enhanced without requiring physical translation of the imaging devices.

Preferably, the imaging device includes a combination of first charge collection contacts which are offset relative to their respective cell circuits, and second charge collection contacts which are in register with their respective cell circuits for more direct connection therewith. The first charge collection contacts can communication with their respective cell circuits by conductive "paths" which extend laterally to positions in register with the respective inputs of the cell circuits.

The term "cell circuit" is used herein to mean generally a circuit for receiving charge from the charge collection contact, and for producing a signal therefrom representative of an image pixel or region. In general, the imaging device may be regarded as including a plurality of detector cells, each cell including a charge collection contact and a respective cell circuit for handling the collect charge. The charge collection contacts may be of any desired size and shape (for example, square, rectangular, round, polygonal). The read-out substrate may also carry or comprise other circuitry, such as control circuitry or multiplexing circuitry associated with a plurality of cell circuits.

In a closely related aspect, the invention provides a semiconductor imaging device comprising a detector substrate exposable to incident radiation and having a plurality of charge collection contacts for collecting charge therefrom, the detector substrate being arranged in front of a readout substrate carrying or comprising readout circuitry, wherein the readout substrate comprises a first region with a respective cell circuit coupled to each charge collection contact for receiving signals from the detector substrate, and a second region with further circuitry associated with and connected to a plurality of cell circuits, and wherein the charge collection contacts are arranged over the first and second regions of the readout substrate.

In a closely related further aspect, the invention provides semiconductor imaging device comprising a detector substrate exposable to incident radiation and having a plurality of charge collection contacts for collecting charge therefrom, the detector substrate being arranged in front of a readout substrate carrying or comprising a readout cell circuit coupled to each charge collection contact for accumulating the charge received from the charge collection contact, at least a first charge collection contact being arranged out of registration with its associated cell circuit and at least a second charge collection contact being arranged in register with its associated cell circuit, wherein the cell circuit for the first charge collection circuit has a different charge accumulation capacitance from the cell circuit for the second charge collection contact.

BRIEF DESCRIPTION OF THE DRAWINGS

FIG. 3 is a schematic view of the Applicants' previously filed imaging device tile;

FIG. 4 is a view of an inclined substrate and integrated circuit of the Applicants' previously filed device;

DESCRIPTION OF EMBODIMENTS OF THE INVENTION

Embodiments of the invention are now described by way of example only with reference to the accompanying further drawings.

Figure 1:
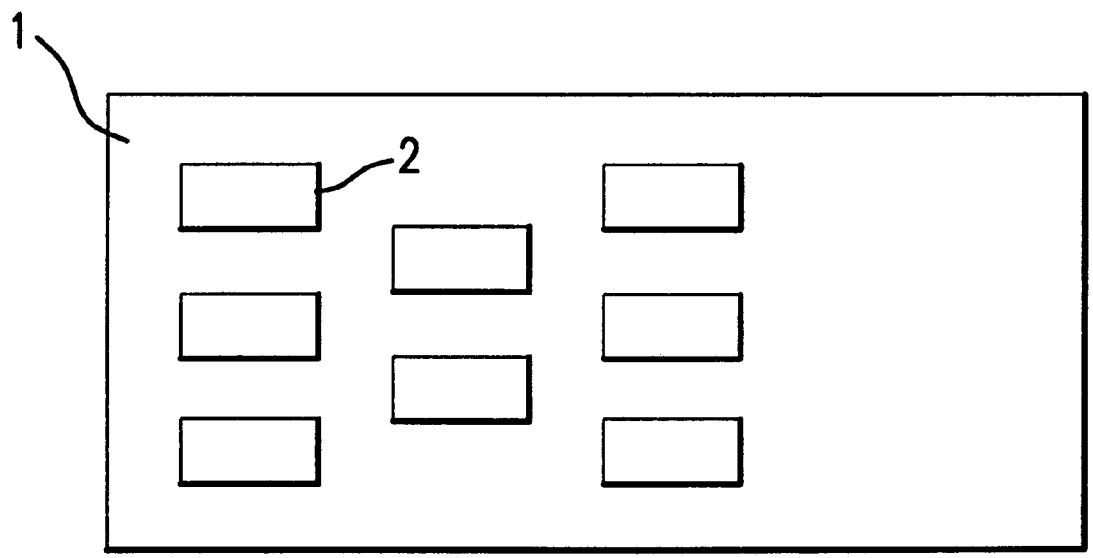
FIG. 1 is an example for reducing inactive regions.
Figure 2:
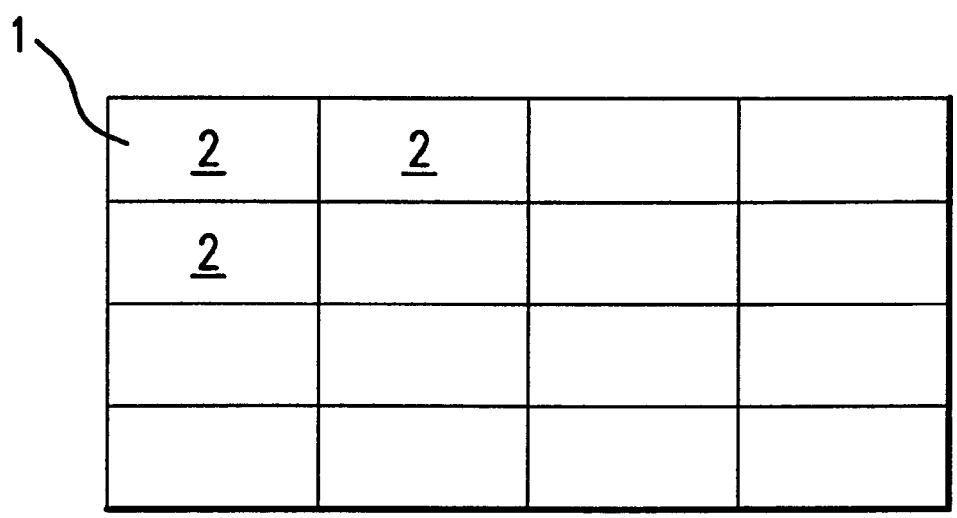
FIG. 2 is an example for reducing inactive regions.
Figure 5:
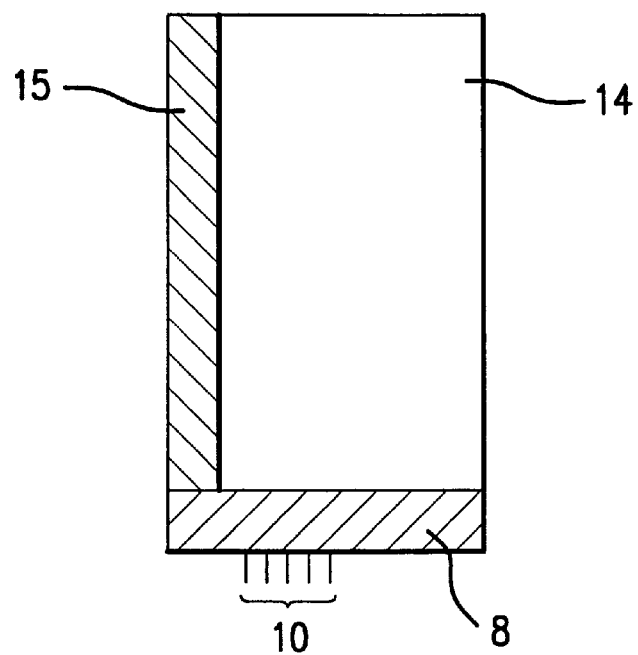
FIG. 5 is a view of a previously filed device of the Applicant.
Figure 6:
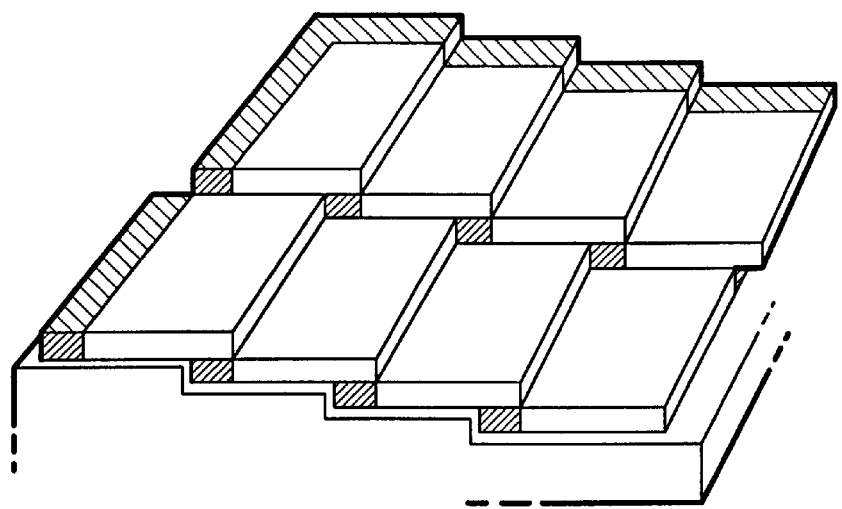
FIG. 6 is an embodiment of a design in European Patent Application Publication No. 0 421 869.
Figure 7:
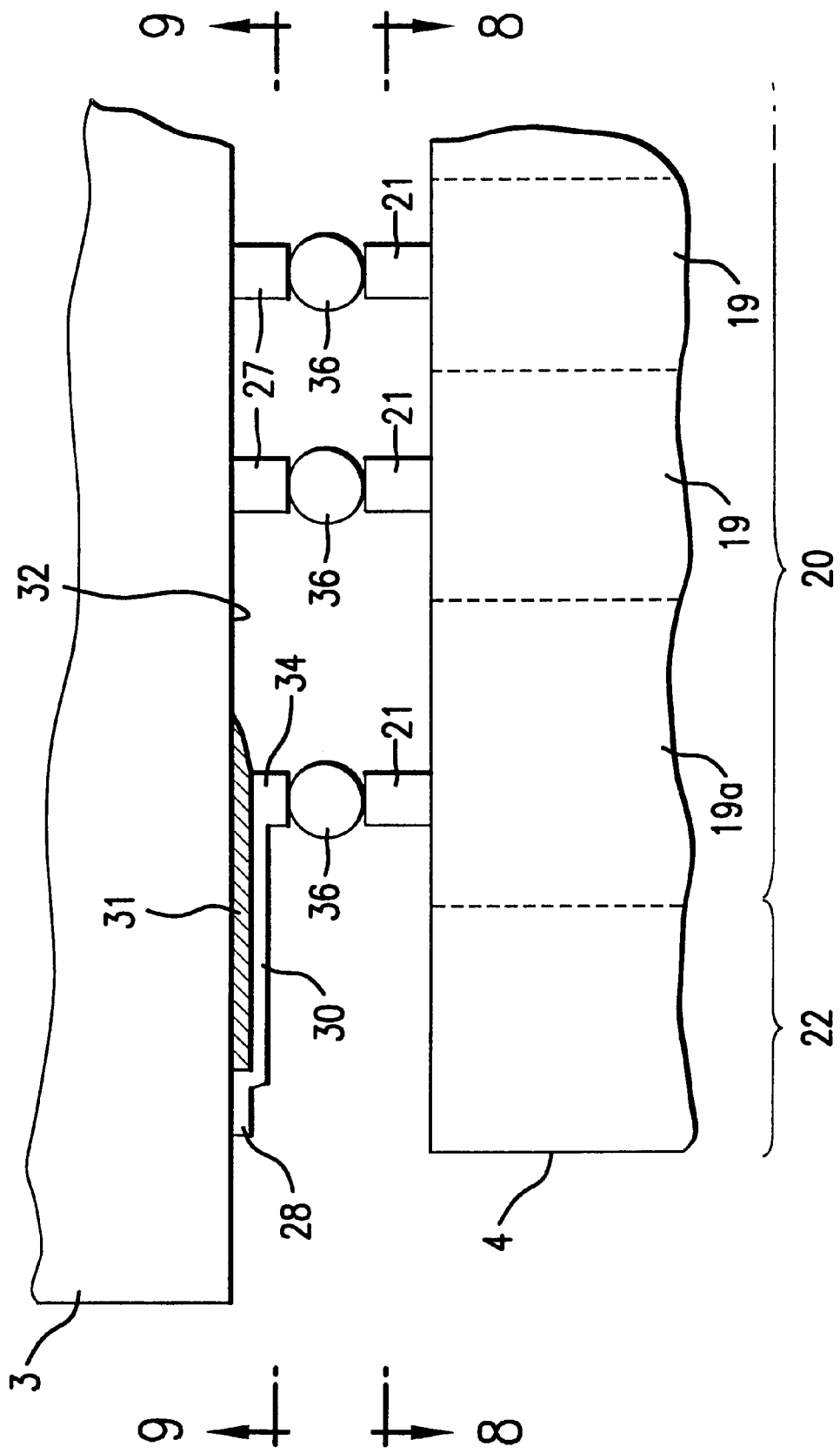
FIG. 7 is a schematic partial side view of a first embodiment of detector.
Figure 8:
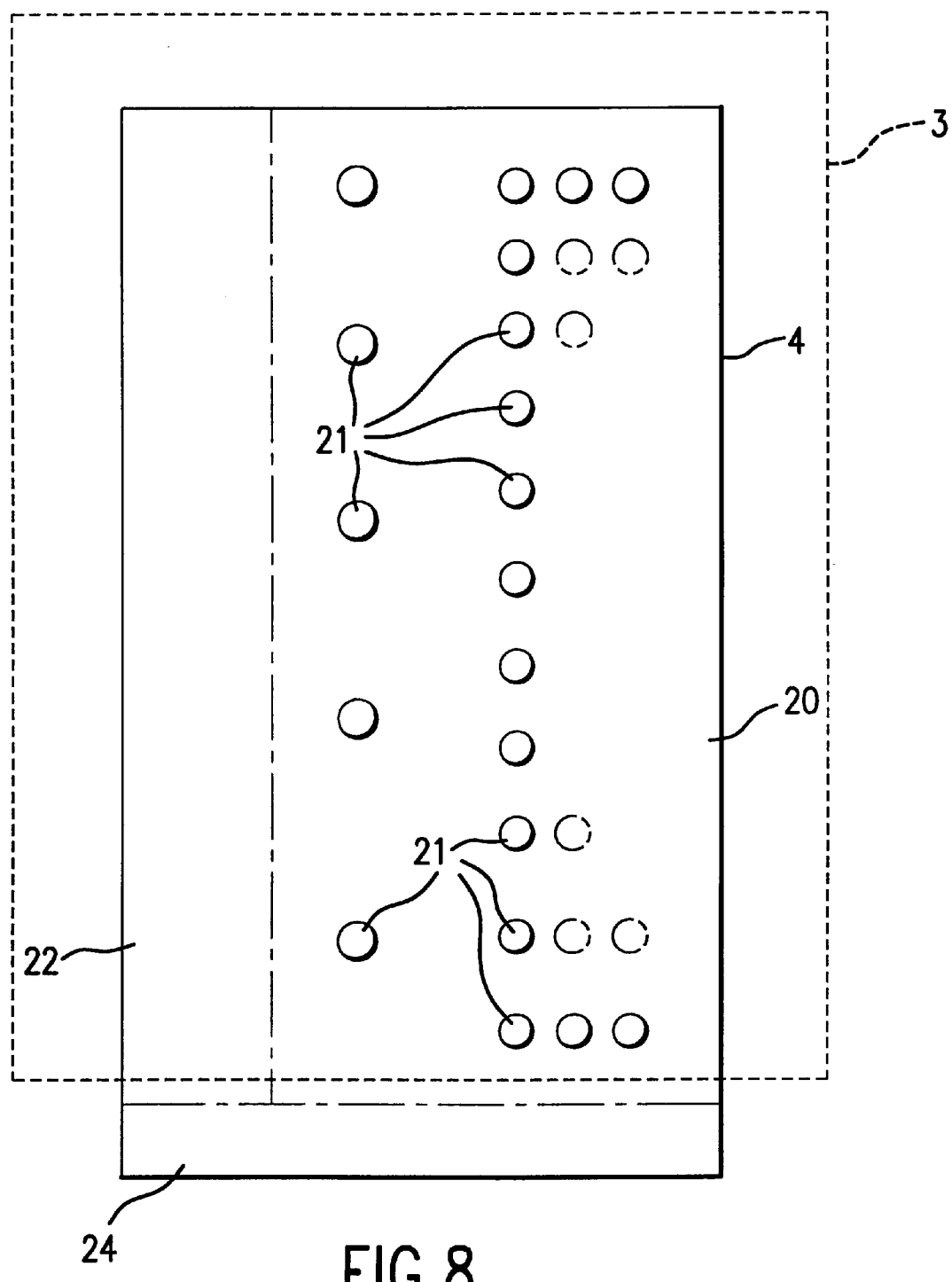
FIG. 8 is a schematic view along the line 8—8 of FIG. 7.
Figure 9:
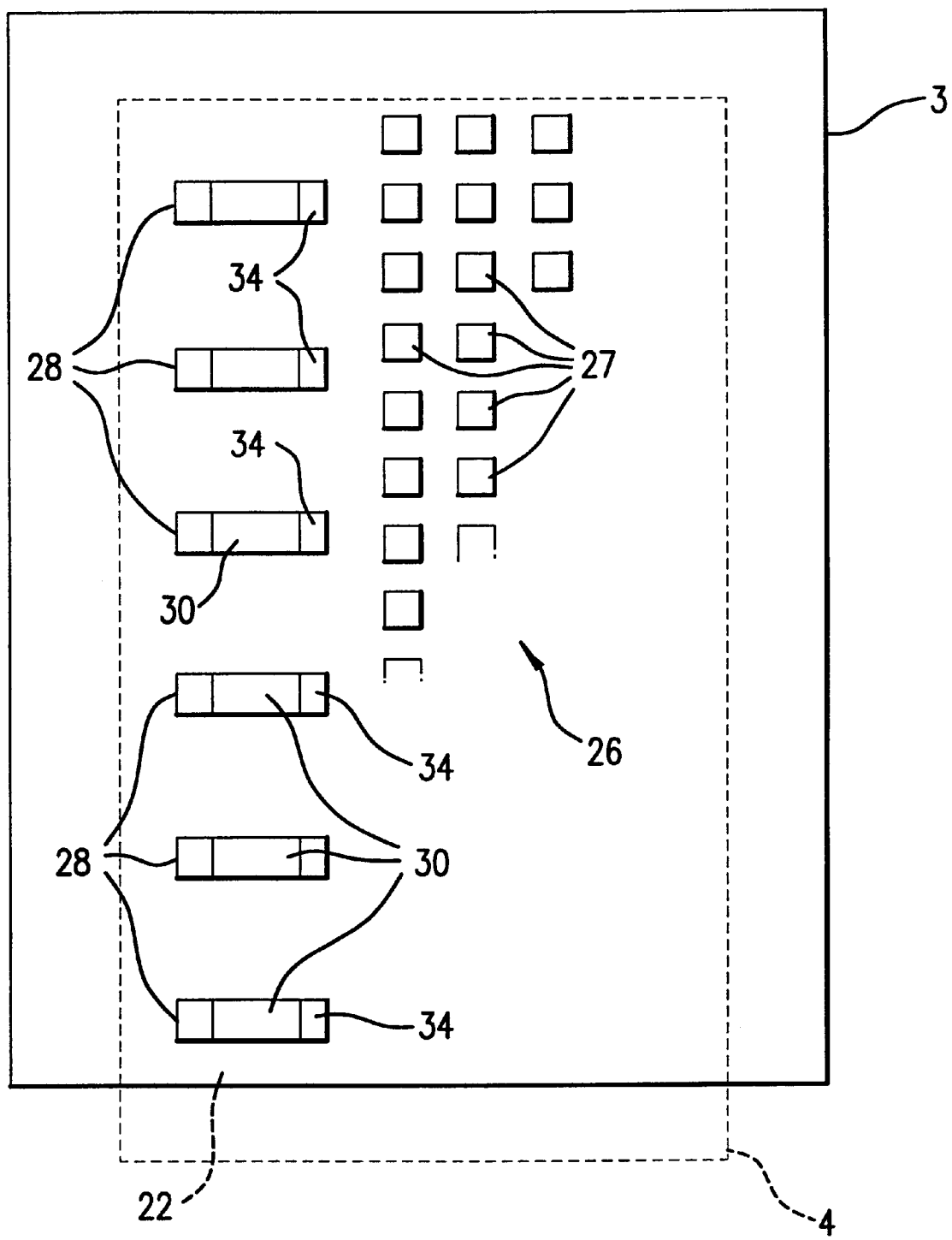
FIG. 9 is a schematic view along the line 9—9 of FIG. 7.

Referring to FIGS. 7, 8 and 9, the detector includes a semiconductor detector substrate 3 exposable to incident radiation and arranged in front of a read out substrate in the form of an integrated circuit 4. In FIG. 8, the position of the detector substrate 3 is indicated by a broken line; in FIG. 9, the position of the integrated circuit is indicated by a broken line. The detector substrate may be of any suitable material, for example, cadmium zinc telluride (CdZnTe), cadmium telluride (CdTe), lead iodide (PbI), gallium arsenide (GaAs), germanium (Ge), silicon (Si), or indium antinomide (InSb). In the present embodiment, CdZnTe is the preferred material.

The integrated circuit 4 includes a first region 20 which contains pixel cell readout circuits 19 with metal inputs 21, a second edge region 22 which contains additional circuitry such as control, decoding and multiplexing circuitry, and a third edge region 24 to which conventional wire connections are made. The substrate overlaps the first and second regions 20 and 22.

In the illustrated embodiment, the circuitry is embodied within the readout substrate using, for example, CMOS technology. The boundaries of cell circuits 19 are illustrated schematically by the broken lines. However, using other technologies, the circuitry may be implemented on the surface of the substrate.

The substrate has pixel (charge collection) contacts 26 formed thereon for connection to the read out cell circuits. The contacts 26 include a regular arrangement of first contacts 27 over the majority of substrate area, and positioned to be directly in register with the inputs of the respective readout circuits.

In accordance with the principles of the invention, the region of the substrate 3 overlying the second region 22 of the integrated circuit 4 is rendered active by the provision of second pixel (charge collection) contacts 28. The second contacts are positioned in the edge region of the substrate outside the first region 20 of the integrated circuit 4 containing the read out cell circuits. In order to communicate with a cell circuit 19a, each second contact 28 is coupled by a conductive path 30 on the surface 32 of the substrate (on the face adjacent to the integrated circuit 4) to an intermediate terminal position 34 which is in register with an input 21 of a respective read out circuit 19a. The conductive path 30 is provided by a metal strip carried by the substrate. The strip only makes electrical contact with the substrate at the position of the charge collection contact 28. In this embodiment, the strip is laid on a layer of passivation material 31 applied to the surface of the detector substrate 3. The passivation material effectively insulates the strip from the substrate 3 except at the position where the strip contacts the substrate directly at the charge collection contact.

The first contacts 26 and the intermediate terminals 34 are bonded electrically to the integrated circuit by microbumps 36. The microbumps may, for example, be grown on the first pixel contacts 26 and on the intermediate terminals 34, or alternatively on the cell circuit input terminals of the integrated circuit 4. The microbump may be of any suitable material, such as indium, solder, or gold.

The spacing between the edgemost pixel contacts (i.e., the second contacts 28) is not necessarily the same as the spacing between the first contacts 26. For example, the spacing of the edgemost contacts may be larger. In that case, each edgemost pixel contact 28 will collect the signal from the ionization produced in a volume of the substrate 3 larger than the volume corresponding to a first pixel contact 26. In order to compensate for this larger signal, the capacitance of the read out circuits for the edgemost pixel contacts 28 should be adjusted accordingly.

Figure 10:
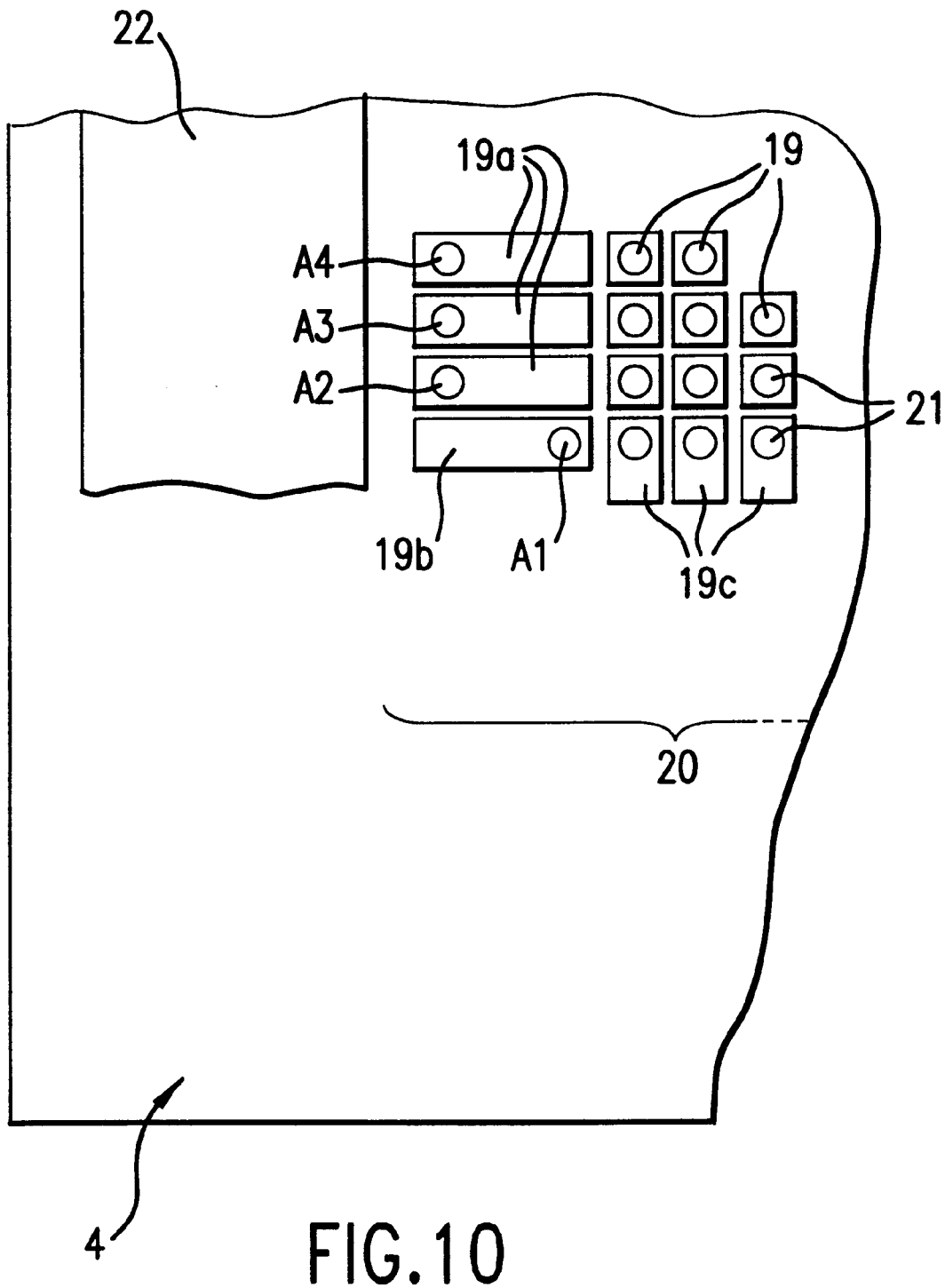
FIG. 10 is a schematic view (similar to FIG. 8) of a second embodiment.
Figure 11:
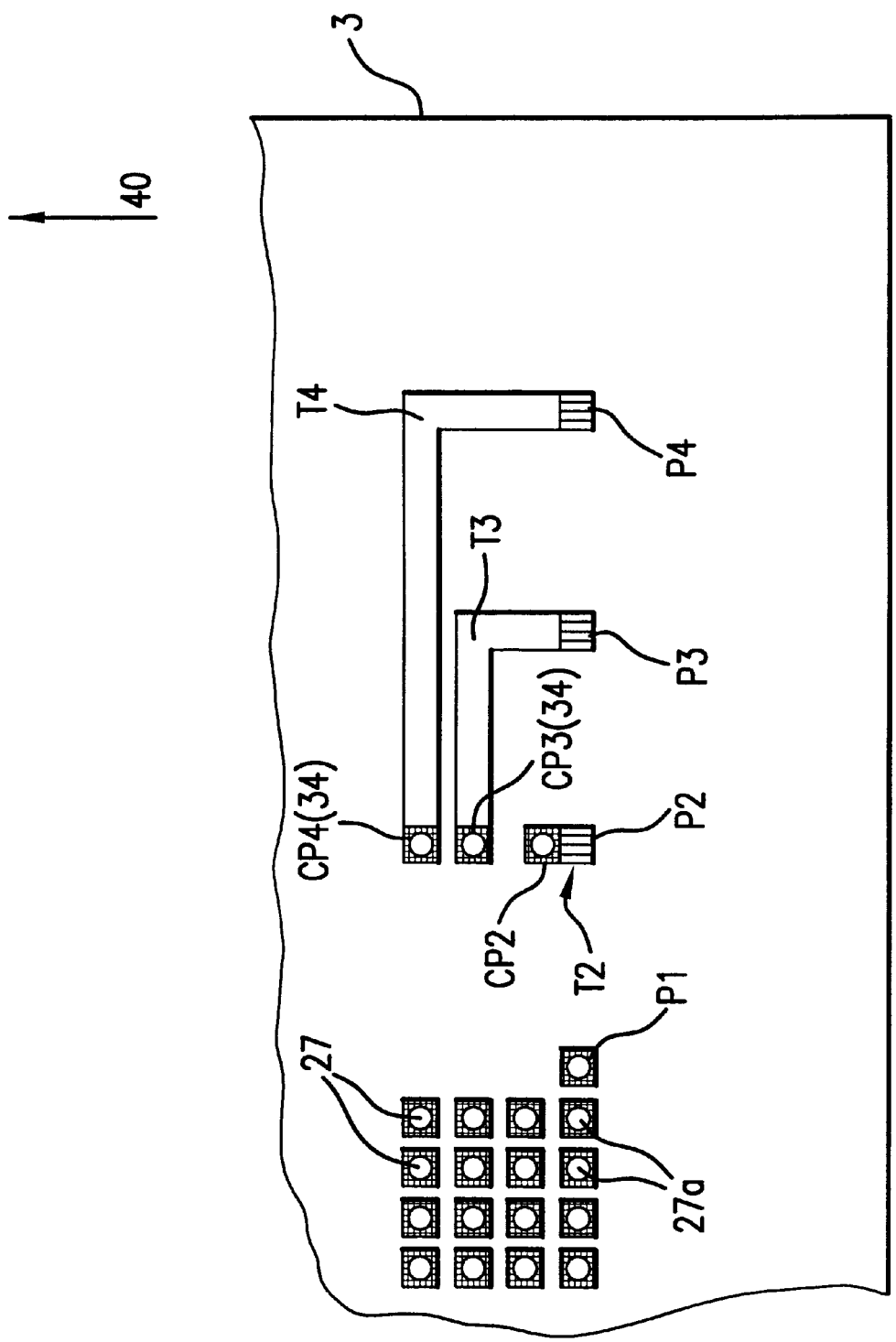
FIG. 11 is a schematic view (similar to FIG. 10) of the second embodiment.

FIGS. 10 and 11 illustrate a second embodiment, including a practical arrangement of contact positions for improved resolution. The same reference numerals used in the first embodiment are used again where appropriate.

The width of the second region 22 (containing the multiplexing and decoding logic) is approximately 350 $\mu$m. In FIGS. 10 and 11, the pixel contact P1 is bonded directly to input A1 of the integrated circuit 4; pixel contact P2 is coupled through metal strip T2 and intermediate terminal CP2 to input A2; pixel contact P3 is coupled through metal strip T3 and intermediate terminal CP3 to input A3; and pixel contact P4 is coupled through metal strip T4 and intermediate terminal CP4 to input A4. The connection pattern repeats as viewed in the direction 40.

In this example implementation, the pixel pitch between the first pixel contacts P is approximately 35 $\mu$m and the pixel pitch among the edgemost pixel contacts (P2–P4, etc.) is approximately 146 $\mu$m. Since the region near the detector edge has a larger pixel pitch, the capacitance of the respective read out circuits corresponding to these larger pixels is larger to compensate for the larger signal. The distance from the outermost pixels to the detector edge is approximately 150 $\mu$m. This is illustrated in FIG. 10 by the schematic outlines of the cell circuits 19a for the spaced apart contacts being larger than the outlines of the cell circuits 19 for the main array of first pixel contacts to accommodate a large charge accumulation capacitance. In FIG. 10, the cell circuit 19b for the lone charge collection contact P1 adjacent to the main array, and the cell circuits 19c for peripheral charge collection contacts 27a of the main array, are also bigger to denote an increased charge accumulation capacitance. In general, each cell circuit has a charge accumulation capacitance in accordance with the expected level of charge likely to be received by the charge collection contact. This depends on the size of the volume of the detector substrate from which the particular charge collection contact is able to receive charge. In turn, this depends on the pitch spacing of adjacent contacts. It will also be appreciated that edgemost contacts may receive more charge because they are not surrounded on all sides by other contacts.

It will be appreciated that the present invention, particularly as illustrated in the preferred embodiments, enables a greater proportion of the detector substrate to be used as active imaging area, even if one or more regions of the integrated circuit or other readout substrate immediately underlying some of the pixels are dedicated for other circuitry, such as control/decoding/multiplexing circuitry.

Although features and aspects of the invention believed to be of particular importance have been identified in the foregoing description, the Applicants claim protection for any novel feature or combination of features described herein and/or illustrated in the drawings irrespective of whether emphasis has been placed thereon.

What we claim is:

1. A semiconductor imaging device comprising a detector substrate exposable to incident radiation and having a plurality of charge collection contacts for collecting charge therefrom, the detector substrate being arranged in front of a readout substrate, each contact being coupled to an input of a respective circuit of an array of readout cell circuits of the readout substrate, the readout substrate associated with further circuitry connected to said cell circuits, said further circuitry disposed in a region of said readout substrate distinct from said array of cell circuits, wherein at least one first charge collection contact from the plurality of charge collection contacts is positioned out of registration with the region of the readout substrate with the cell circuit for the at least one charge collection contact and overlapping said distinct region of the readout substrate.

2. A device according to claim 1, wherein said at least one first charge collection contact is positioned out of registration with the input of the cell circuit.

3. A semiconductor imaging device comprising a detector substrate exposable to incident radiation and having a plurality of charge collection contacts for collecting charge therefrom, the detector substrate being arranged in front of a readout substrate, each contact being coupled to an input of a respective circuit of an array of read out cell circuits of the readout substrate, the readout substrate associated with further circuitry connected to said cell circuits, said further circuitry disposed in a region of said readout substrate distinct from said array of cell circuits, wherein at least one first charge collection contact from the plurality of charge collection contacts is positioned out of registration with the input of the cell circuit for the contact and overlapping said distinct region of the readout substrate.

4. A device according to claim 1, wherein at least one second contact is in registration with the input of its associated cell circuit to establish a connection thereto.

5. A device according to claim 3, wherein at least one second contact is in registration with the input of its associated cell circuit to establish a connection thereto.

6. A device according to claim 4, comprising a plurality of first charge collection contacts, and a plurality of second contacts.

7. A device according to claim 5, comprising a plurality of first charge collection contacts, and a plurality of second contacts.

8. A device according to claim 6, wherein the majority of contacts are second contacts.

9. A device according to claim 7, wherein the majority of contacts are second contacts.

10. A device according to claim 6, wherein at least some of the first charge collection contacts are located towards an edge of the detector substrate.

11. A device according to claim 7, wherein at least some of the first charge collection contacts are located towards an edge of the detector substrate.

12. An imaging system comprising a plurality of imaging device modules, each module comprising an imaging device as defined in claim 1.

13. An imaging system comprising a plurality of imaging device modules, each module comprising an imaging device as defined in claim 3.

14. A device according to claim 1, wherein said further circuitry comprises control circuitry.

15. A device according to claim 3, wherein said further circuitry comprises control circuitry.

16. A device according to claim 1, wherein said further circuitry comprises a multiplexing circuit for producing a multiplexed output signal.

17. A device according to claim 3, wherein said further circuitry comprises a multiplexing circuit for producing a multiplexed output signal.

18. A device according to claim 1 further comprising a respective conductive path linking a respective first charge collection contact with a respective intermediate terminal position in registration with the input of the respective cell circuit.

19. A device according to claim 3 further comprising a respective conductive path linking a respective first charge collection contact with a respective intermediate terminal position in registration with the input of the respective cell circuit.

20. A device according to claim 18, wherein the respective conductive path is carried on the face of the detector substrate.

21. A device according to claim 19, wherein the respective conductive path is carried on the face of the detector substrate.

22. A device according to claim 18, wherein the respective conductive path is in electrical contact with the detector substrate only at the position of the charge collecting contact.

23. A device according to claim 19, wherein the respective conductive path is in electrical contact with the detector substrate only at the position of the charge collecting contact.

24. A device according to claim 18, wherein the respective conductive path comprises a metal conductor.

25. A device according to claim 19, wherein the respective conductive path comprises a metal conductor.

26. A device according to claim 1, wherein the charge collection contacts are electrically coupled to the readout substrate through microbumps.

27. A device according to claim 3, wherein the charge collection contacts are electrically coupled to the readout substrate through microbumps.

28. A semiconductor imaging device comprising a detector substrate exposable to incident radiation and having a plurality of charge collection contacts or collecting charge therefrom, the detector substrate being arranged in front of a readout substrate associated with further circuitry comprising readout circuitry, wherein the readout substrate comprises a first region with a respective cell circuit coupled to each charge collection contact, and capable of receiving signals from the detector substrate, and a second region with further circuitry associated with and connected to a plurality of cell circuits, and wherein the charge collection contacts are arranged over the first and second regions of the readout substrate.

29. A device according to claim 28, comprising conductor extending from the charge collection contacts overlying the second region of the readout substrate to positions overlying respective cell circuits of the first region.

30. A device according to claim 1, wherein the charge collection contacts define an active area of the detector substrate which is substantially coextensive in at least one dimension with the readout substrate.

31. A device according to claim 3, wherein the charge collection contacts define an active area of the detector substrate which is substantially coextensive in at least one dimension with the readout substrate.

32. A device according to claim 28, wherein the charge collection contacts define an active area of the detector substrate which is substantially coextensive in at least one dimension with the readout substrate.

33. A device according to claim 1, wherein each cell circuit comprises a circuit for accumulating charge received from a respective charge collection contact.

34. A device according to claim 3, wherein each cell circuit comprises a circuit for accumulating charge received from a respective charge collection contact.

35. A device according to claim 28, wherein each cell circuit comprises a circuit for accumulating charge received from a respective charge collection contact.

36. A device according to claim 33, wherein a cell circuit associated with a charge collection contact not in registration with the cell circuit, has a charge accumulation capacitance in accordance with the expected signal level from said charge collection contact not in registration with the cell circuit.

37. A device according to claim 34, wherein a cell circuit associated with a charge collection contact not in registration with the cell circuit, has a charge accumulation capacitance in accordance with the expected signal level from said charge collection contact not in registration with the cell circuit.

38. A device according to claim 35, wherein a cell circuit associated with a charge collection contact not in registration with the cell circuit, has a charge accumulation capacitance in accordance with the expected signal level from said charge collection contact not in registration with the cell circuit.

39. An imaging system comprising a plurality of imaging device modules, each module comprising an imaging device as defined in claim 28.

40. A semiconductor imaging device comprising a detector substrate exposable to incident radiation and having a plurality of charge collection contacts for collecting charge therefrom, the detector substrate being arranged in front of a readout substrate associated with further circuitry comprising a readout cell circuit coupled to each charge collection contact for accumulating the charge received from the charge collection contact, at least a first charge collection contact being arranged out of registration with its associated cell circuit and at least a second charge collection contact being arranged in register with its associated cell circuit, wherein the cell circuit from the first charge collection contact has a different charge accumulation capacitance from the cell circuit for the second charge collection contact.

* * * * *